United States Patent [19]

Kishimoto et al.

[11] Patent Number: 4,586,789

[45] Date of Patent: May 6, 1986

[54] LIQUID CRYSTAL DISPLAY UNIT WITH PARTICULAR ELECTRODE TERMINAL GROUPINGS

[75] Inventors: Munehisa Kishimoto; Noboru Sakata; Miyoshi Kimura, all of Yokohama; Kouichi Fujiwara, Musashino; Hidekazu Komura, Yokohama, all of Japan

[73] Assignee: Hitachi, Ltd., Tokyo, Japan

[21] Appl. No.: 538,810

[22] Filed: Oct. 5, 1983

[30] Foreign Application Priority Data

Oct. 8, 1982 [JP] Japan ................................ 57-176107

[51] Int. Cl.$^4$ ............................................... G02F 1/13
[52] U.S. Cl. ...................................... 350/336; 350/333
[58] Field of Search ......................... 350/333, 334, 336

[56] References Cited

U.S. PATENT DOCUMENTS 3,928,658  12/1975  Van Boxtel et al. ............ 350/334 X

FOREIGN PATENT DOCUMENTS 55-512    1/1980  Japan.
56-70657  6/1981  Japan.

*Primary Examiner*—John K. Corbin
*Assistant Examiner*—Richard F. Gallivan
*Attorney, Agent, or Firm*—Antonelli, Terry & Wands

[57] ABSTRACT

Electrode terminals provided on a liquid crystal display element for connection to an external drive circuit are arranged in two rows, and lead wires for exterior electrode terminals are collectively passed through space portions provided in the course of the row composed of interior electrode terminals.

5 Claims, 11 Drawing Figures

LIQUID CRYSTAL DISPLAY UNIT WITH PARTICULAR ELECTRODE TERMINAL GROUPINGS

BACKGROUND OF THE INVENTION

1. Field of the Invention

The present invention relates to a liquid crystal display unit, and in particular to an electrode terminal structure for connecting a liquid crystal display element to an external drive circuit.

2. Description of the Prior Art

Liquid crystal has an optical permeability ratio which is controllable by the applied voltage thereto. Such a characteristic has brought about its widespread use as a display unit. FIG. 1A and FIG. 1B are respectively a top view and a side view of an example of structure of a liquid crystal display element 1. On surfaces of two glass plates, i.e., an upper glass plate 2 and a lower glass plate 3, scan electrodes 5 and signal electrodes 4 and 4' respectively composing stripes are formed. Each of intersecting points formed by the scan electrodes 5 and signal electrodes 4 and 4' constitutes one picture element, and forming a liquid crystal display portion 6. Two glass plates 2 and 3 are bonded together through a spacer 7 utilizing glass fibers or the like. Into a space formed by the two glass plates 2 and 3 and the spacer 7, liquid crystal 8 is enclosed.

A prior art for connecting the above described liquid crystal display element to an external drive circuit will now be described hereinafter.

FIG. 2 shows an example of a conventional electrode terminal structure for connecting the liquid crystal display element 1 illustrated in FIG. 1A and FIG. 1B to an external drive circuit. In a conventional liquid crystal display element, it is possible to arrange one-row electrode terminals 9 as illustrated in FIG. 2 with a pitch a of approximately, 1 mm, because of a small number of display characters and hence of electrode terminals connected to the external drive circuit.

For actual connection of the liquid crystal display element 1 to the external drive circuit, a connecting member 10 is employed. The connecting member 10 is composed of insulative rubber 11 and a plurality of metal conductive pieces 12 each having $\phi$ of 25 $\mu$m, for example, which are so arranged within the insulative rubber 1 that both ends thereof are exposed at upper and lower faces of the insulative rubber. The space between the conductive pieces is smaller than the pitch a of the electrode terminals 9 illustrated in FIG. 2. The connecting member 10 is placed on the liquid crystal display element 1 so as to be perpendicular to the electrode terminals 9 of the liquid crystal display element 1 shown in FIG. 2. On the connecting member 10, a drive circuit substrate having electrode terminals so arranged as to confront the electrode terminals 9, thereby the liquid crystal display element 1 being connected to the external drive circuit.

However, with the advance of increase in display functions and displayed contents of a liquid crystal display element, the number of electrode terminals increases greatly. In one-row arrangement as illustrated in FIG. 2, the terminal pitch a is then reduced. Accordingly, a high-precision technique is demanded for connection to the external drive circuit substrate, and leakage between terminals is apt to be incurred, causing problems in practical use.

For example, if the liquid crystal display element 1 illustrated in FIG. 1 is so small-sized as to have a diagonal line of the liquid crystal display portion 6 which is approximately 3 inches in length and each of the upper signal electrode 4 and the lower signal electrode 4' has 160 electrodes, the pitch a in the electrode terminal structure as illustrated in FIG. 2 is approximately 0.4 mm. When the liquid crystal display element is to be connected to the external drive circuit substrate through a connection which can be easily attached or removed such as a connecting member 10 as illustrated in FIG. 3, the pitch of 0.4 mm is too small to assure stable connection in practical use.

In order to eliminate the above described drawbacks, Japanese Patent Laid-Open No. 512/80 specification and Japanese Utility Model Laid-Open No. 70657/81 specification propose a liquid crystal display device wherein electrode terminals for connection to an external drive circuit substrate are arranged to form two or more rows. FIG. 4 shows a practical example of this proposal. In the practical example, electrode terminals are composed of two kinds of electrode terminals, i.e., exterior electrode terminals 13 and interior electrode terminals 14. In this case, the pitch b of the exterior electrode terminals 13 is twice the pitch a in case of one-row electrode terminal arrangement. Since the interior electrode terminal 14 is adjacent to lead wires 15 for the exterior electrode terminal 13, however, the substantial pitch b' of the interior electrode terminals is not sufficiently large. Assuming that the pitch a of the electrode terminals in one-row arrangement is 0.4 mm and the width of the lead wire 15 for the exterior electrode terminal 13 is 0.05 mm, for example, the substantial pitch b' of the interior electrode terminals 14 is 0.5 mm. As a result, the two-row arrangement has brought about only a small effect in increasing the terminal pitch.

In the electrode terminals for connection of two-row arrangement as shown in FIG. 4, a part of the lead wire 15 for the exterior electrode terminal 13 is covered by an insulative material 16 for the lead wire 15 not to be exposed, for example, as shown in FIG. 5. Thereby, the pitch of the interior electrode terminals 14 may be increased. However, this approach brings about a higher cost due to increased manufacturing processes.

SUMMARY OF THE INVENTION

An object of the present invention is to eliminate the above described drawbacks of the prior arts in the course of increase in the number of functions and displayed contents of a liquid crystal display unit and to provide an electrode terminal structure of a liquid crystal display unit having high productivity in mass production and a low cost.

In accordance with the present invention, there are provided liquid crystal display elements wherein electrode terminals for connection to an external drive circuit are arranged in two rows to increase the terminal pitch and in the course of the interior electrode terminal row at least one space portion is provided for passing lead wires of exterior electrode terminals.

DESCRIPTION OF PREFERRED EMBODIMENTS

Figure 6:
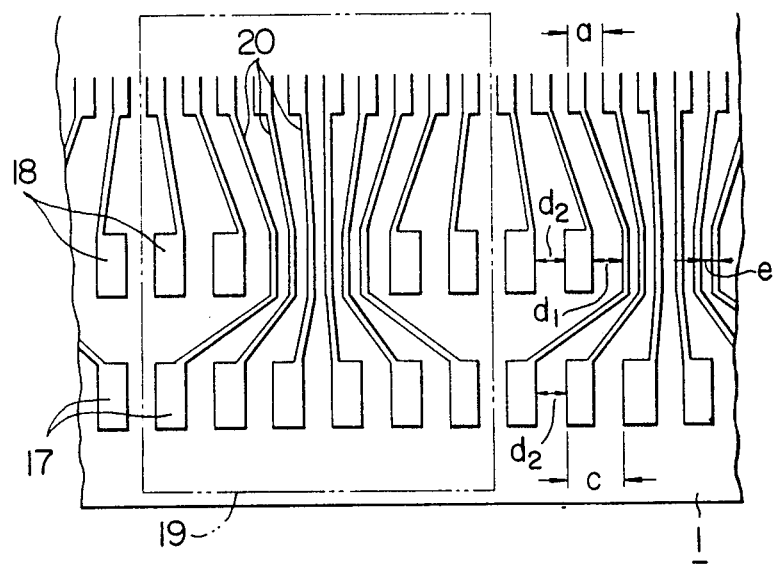
FIG. 6 is a top view of an electrode terminal structure of a liquid crystal display element included in a liquid crystal display unit according to the present invention.

Embodiments of the present invention will be hereinafter described referring to drawings. FIG. 6 shows an embodiment of an electrode terminal structure of a liquid crystal display unit according to the present invention. As illustrated in FIG. 6, electrode terminals on a liquid crystal display element 1 are composed of exterior electrode terminals 17 and interior electrode terminals 18, a two-row structure being formed. The number of interior electrode terminals is chosen to be smaller than that of exterior electrode terminals. The lead wires 20 of the exterior electrode terminals 17 are passed through a space portion existing within the row of interior electrode terminals 18. The space $d_1$ between a lead wire 20 and its adjacent interior electrode terminal 18 is chosen close to the space $d_2$ between the electrode terminals.

The distribution ratio of electrode terminals into the interior and exterior terminals is not particularly limited but may be arbitrarily chosen. In FIG. 6 the ratio of the number of exterior electrode terminals to that of interior electrode terminals is chosen to be 3:2 and electrode terminal groups 19 respectively composed of ten electrode terminals are placed one after another. If high density electrode terminals having a terminal pitch a of 0.4 mm in case of one-row arrangement are arranged according to the terminal structure as illustrated in FIG. 6, an enlarged electrode terminal pitch c of approximately 0.67 mm is obtained. The lead wires 20 of the exterior electrode terminals 17 are collected and passed through the space portion of the interior electrode terminal 18 with an inter-lead pitch e of approximately 0.2 mm. The exterior electrode terminals 17 are placed with the same terminal pitch c as the interior electrode terminals 18. Thus, it becomes unnecessary to apply treatment such as insulative covering to the lead wires 20 of the exterior electrode terminals 17. As a result, an inexpensive liquid crystal display element 1 may be realized.

As described above, it becomes possible to increase an electrode terminal pitch without increasing manufacturing processes by arranging electrode terminals used for connection in a liquid crystal display element according to the embodiment. As a result, a high precision technique is not required. And the liquid crystal display element may be connected to an external drive circuit substrate via a connecting means suitable to mass production such as a conductive connecting member.

Figure 7:
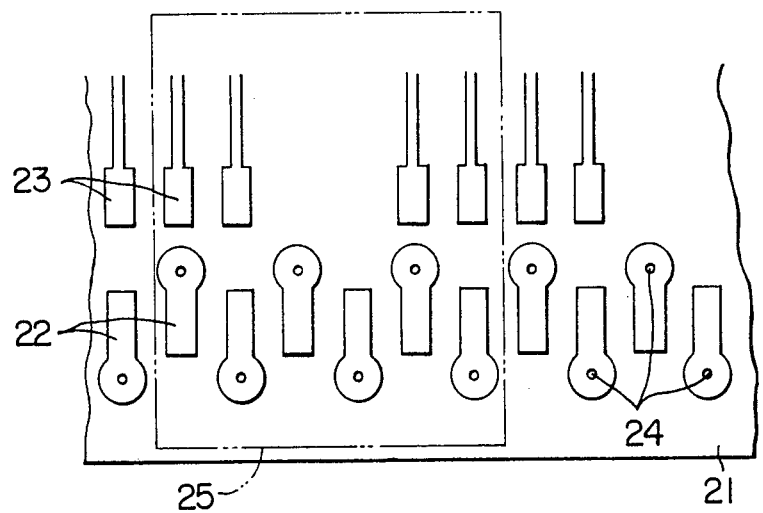
FIG. 7 is a bottom view of a terminal structure of an external drive circuit substrate according to the present invention.

FIG. 7 shows an example of a terminal structure of an external drive circuit substrate which is connected to a liquid crystal display element having electrode terminals illustrated in FIG. 6. As illustrated in FIG. 7, electrode terminals of an external drive circuit substrate 21 are composed of two rows, i.e., exterior terminals 22 and interior terminals 23 so that an electrode terminal on an external drive circuit substrate 21 may confront an associated terminal on the liquid crystal display element 1 when the substrate 21 is aligned with and confronted with the liquid crystal display element 1. A lead wire for an exterior terminal on the external drive circuit substrate 21 is passed through a through hole 24 provided near an exterior terminal 22 and wired on the rear face of the substrate 21. Numeral 25 denotes a terminal group corresponding to an electrode terminal group 19.

Figure 8:
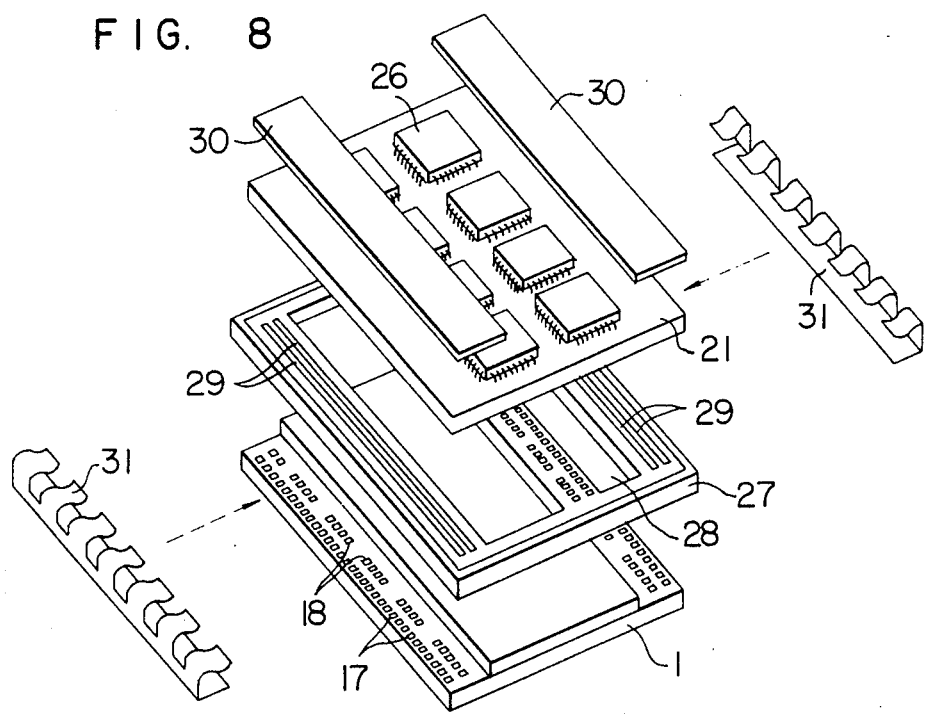
FIG. 8 is an oblique view of a disjointed liquid crystal display unit according to the present invention before assembling.

FIG. 8 is an oblique view of a disjointed liquid crystal display unit according to the present invention before assembling. In FIG. 8, the lowest member is a liquid crystal display element 1 having electrode terminal structures illustrated in FIG. 6 at both ends thereof. The exterior electrode terminals 17 and interior electrode terminals 18 are represented by dots.

The member 21 illustrated at the top of FIG. 8 is an external drive circuit substrate on which a drive circuit 26 composed of LSI's is mounted. The rear face of the substrate 21 has terminal groups illustrated in FIG. 7 thereon.

Figure 1A:
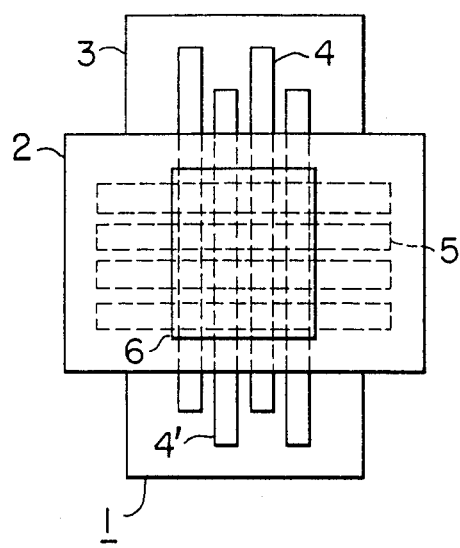
FIG. 1A shows a top view of a typical liquid crystal display element.
Figure 1B:
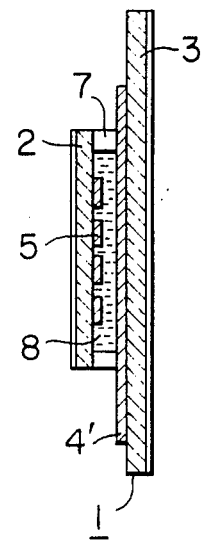
FIG. 1B shows a side view of the element illustrated in FIG. 1A.
Figure 2:
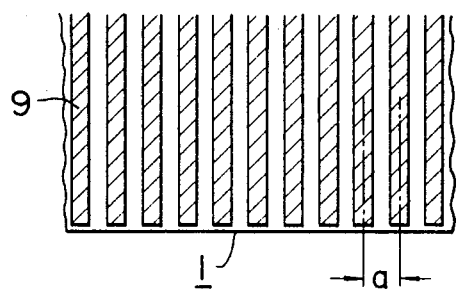
FIG. 2 shows a top view of a conventional electrode terminal structure.
Figure 3:
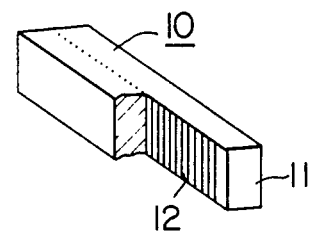
FIG. 3 shows an oblique view of a partially broken conventional connecting material.
Figure 4:
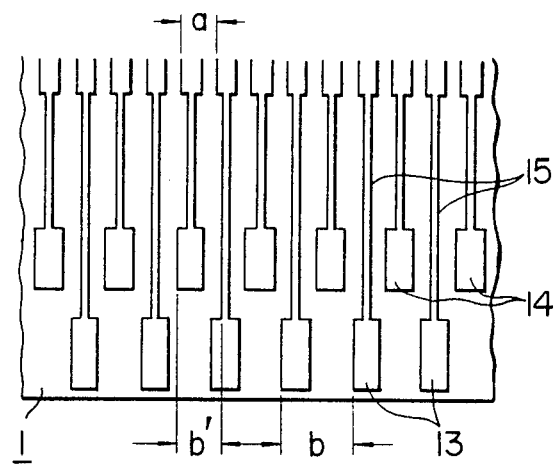
FIG. 4 and FIG. 5 are top views of conventional electrode terminal structures.
Figure 5:
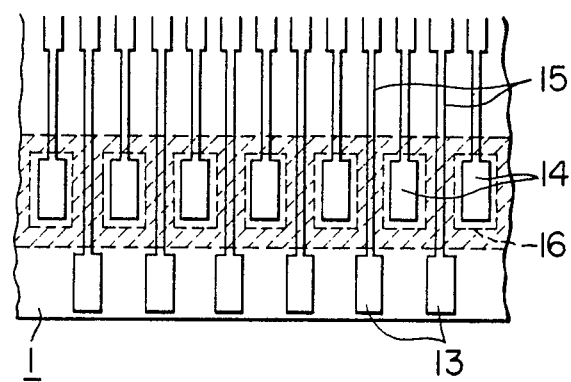

A frame 27 is placed between the liquid crystal display element 1 and the external drive circuit substrate 21. The frame 27 has a large opening 28 for accepting projections such as glass plates of the liquid crystal display element 1 and four slits 29 for accepting the connecting member 10 illustrated in FIG. 3. By inserting the connecting member 10 into the slit 29 of the frame 27, by placing the frame 27 on the liquid crystal display element 1 and by placing the external drive circuit substrate 21 thereon, the electrode terminals 17 and 18 are electrically connected to the drive circuit via the conductive pieces 12 in the connecting member 10.

Finally, by placing insulative plates 30 on both edges of the external drive circuit substrate 21 and applying pressure springs 31 to both sides, all elements illustrated in FIG. 8 are mechanically integrated.

Figure 9:
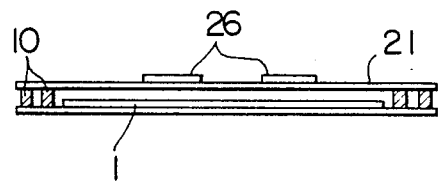
FIG. 9 is a sectional view of principal parts of the liquid crystal display unit illustrated in FIG. 8.

FIG. 9 is a sectional view of only electrical elements among elements illustrated in FIG. 8. When the pitch of the conductive pieces 12 in the connecting member 10 is extremely small in the connection illustrated in FIG. 8, it is not necessary to align the conductive pieces 12 with the pitch c of the electrode terminals 17 and 18. And it becomes possible to prevent occurrence of a connection fault such as short circuit without applying insulative cover process to the lead wire 20 for the exterior electrode terminals 17 of the liquid crystal display element 1.

Figure 10:
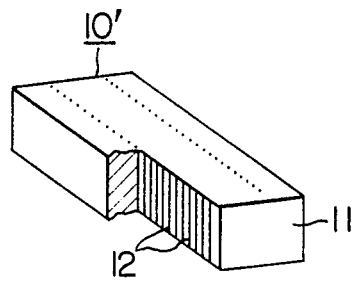
FIG. 10 is an oblique view of a partially broken connecting member.

In the foregoing embodiment, two connecting members 10 respectively corresponding to exterior electrode terminals and interior electrode terminals are placed on one edge of the liquid crystal display element 1. Use of a connecting member 10' having two groups of conductive pieces as illustrated in FIG. 10 facilitates insertion of the connecting member into the frame 27. In this case, it is a matter of course that the frame 27 has a large opening 28 and two slits 29.

For a connection between a liquid crystal display element having many functions and many display contents, the present invention thus provides a connection which is suited to mass production using an inexpensive liquid crystal display element without increasing manufacturing processes of the liquid crystal display element.

In FIG. 6, the ratio of the number of exterior electrode terminals to that of interior electrode terminals is 3:2. It becomes possible to further increase the electrode pitch c by choosing a distribution ratio which is closer to 1:1 or decreasing the pitch e between the lead wires 20.

In an electrode terminal structure for connecting a liquid crystal display element to an external drive circuit according to the present invention, the electrode terminal pitch may be increased without adding any manufacturing process such as insulative cover process by choosing the number of interior terminals within electrode terminals composed of two rows less than that of exterior terminals and by passing lead wires for the exterior terminals through space portions in the row composed of interior terminals. Therefore, as the pitch of electrode terminals for connecting a liquid crystal display element having many functions and many display contents to an external drive circuit substrate, a sufficiently large value may be chosen. As a result, it is possible to obtain a connection which is efficient in mass production without the necessity for high-precision alignment.

We claim:

1. A liquid crystal display unit comprising:
a liquid crystal display element having a liquid crystal display portion;
a drive circuit for applying voltage to said liquid crystal display portion; and
electrode terminal groups provided on said liquid crystal display element and used for connecting said liquid crystal display portion to said drive circuit, said electrode terminal groups further comprising:
a first electrode terminal group arranged with a first predetermined space having at least one space portion in the course of the arrangement thereof, said space portion having a width which is larger than said first predetermined space; and
a second electrode terminal group arranged with another space which is close to said first predetermined space, said second electrode terminal group being connected to wire paths collectively passed through said space portion;
said drive circuit being provided on a drive circuit substrate, and said drive circuit substrate being connected to said first electrode terminal group and said second electrode terminal group via connecting members, said drive circuit substrate having a third electrode terminal group and a fourth electrode terminal group so arranged as to respectively confront said first electrode terminal group and said second electrode terminal group arranged on said liquid crystal display element, and said first electrode terminal group and said second electrode terminal group being respectively connected to said third electrode terminal group and said fourth electrode terminal group via said connecting members, said connecting members comprising:
a first connecting member having therein a first group of a plurality of conductive pieces arranged with a space which is narrower than said first predetermined space so that both ends of each conductive piece will be exposed respectively toward said first electrode terminal group and said third electrode terminal group, said first connecting member being covered by an insulative material; and
a second connecting member having therein a second group of a plurality of conductive pieces arranged with a space which is narrower than said first predetermined space so that both ends of each conductive piece will be exposed respectively toward said second electrode terminal group and said fourth electrode terminal group, said second connecting member being covered by an insulative material, said first connecting member and said second connecting member being integrated, said intergrated connecting member having therein said first group of conductive pieces and said second group of conductive pieces in the form of two rows.

2. A liquid crystal display unit according to claim 1, wherein said second electrode terminal group is placed near the exterior edge of said liquid crystal display element, and said first electrode terminal group is placed inside said second electrode terminal group.

3. A liquid crystal display unit comprising at least a liquid crystal display element having a liquid crystal display portion and electrode terminal groups, and a drive circuit substrate for applying voltage to said liquid crystal display portion via said electrode terminal groups, said electrode terminal groups of said liquid crystal display element including at least a first electrode terminal group arranged with a first predetermined spacing and having at least one space portion in the course of the arrangement of said first electrode terminal group, said at least one space portion having a width which is larger than said first predetermined spacing, and a second electrode terminal group positioned in parallel with said first electrode terminal group and arranged with another spacing which is close to said first predetermined spacing, said second electrode terminal group being connected to wire paths collectively passed through said at least one space portion in said first electrode terminal group, said drive circuit substrate being further provided with a third electrode terminal group and a fourth electrode terminal group positioned in parallel with said first electrode terminal group and said second electrode terminal group of said liquid crystal display element, said second and fourth electrode terminal groups being placed near the exterior edge of said liquid crystal display element and said drive circuit substrate, respectively, and said first and third electrode terminal groups being placed in parallel inside of said second and fourth electrode terminal groups, respectively.

4. A liquid crystal display unit comprising at least a liquid crystal display element having a liquid crystal display portion and electrode terminal groups, and a drive circuit substrate for applying voltage to said liquid crystal display portion via said electrode terminal groups, said electrode terminal groups of said liquid crystal display element including at least a first electrode terminal group arranged with a first predetermined spacing and having at least one space portion in the course of the arrangement of said first electrode terminal group, said at least one space portion having a width which is larger than said first predetermined spacing, and a second electrode terminal group positioned in parallel with said first electrode terminal group and arranged with another spacing which is close to said first predetermined spacing, said second electrode terminal group being connected to wire paths collectively passed through said at least one space portion in said first electrode terminal group, said drive circuit substrate being further provided with a third electrode terminal group and a fourth electrode terminal group positioned in parallel with said first electrode terminal group and said second electrode terminal group of said liquid crystal display element, said third and fourth electrode terminal groups of said drive circuit substrate being respectively connected with said first and second electrode terminal groups of said liquid crystal display element via connecting members, said connecting members including:

- a first connecting member having therein a first group of a plurality of conductive pieces arranged with a spacing which is narrower than said first predetermined spacing so that both ends of each conductive piece will be exposed respectively toward said first electrode terminal group and said third electrode terminal group, said first connecting member being covered by an insulative material; and
- a second connecting member having therein a second group of a plurality of conductive pieces arranged with a spacing which is narrower than said first predetermined spacing so that both ends of each conductive piece will be exposed respectively toward said second electrode terminal group and said fourth electrode terminal group, said second connecting member being covered by an insulative material;
- said liquid crystal display element and said drive circuit substrate being held by pressure applying means with said connecting members being disposed therebetween.

5. A liquid crystal display unit comprising at least a liquid crystal display element having a liquid crystal display portion and electrode terminal groups, and a drive circuit substrate for applying voltage to said liquid crystal display portion via said electrode terminal groups, said electrode terminal groups of said liquid crystal display element including at least a first electrode terminal group arranged with a first predetermined spacing and having at least one space portion in the course of the arrangement of said first electrode terminal group, said at least one portion having a width which is larger than said first predetermined spacing, and a second electrode terminal group positioned in parallel with said first electrode terminal group and arranged with another spacing which is close to said first predetermined space, said second electrode terminal group being connected to wire paths collectively passed through said at least one space portion, said drive circuit substrate being further provided with a third electrode terminal group and a fourth electrode terminal group positioned in parallel with said first electrode terminal group and said second electrode terminal group of said liquid crystal display element respectively, and said third and fourth electrode terminal groups of said drive circuit substrate being respectively connected with said first and second electrode terminal groups of said liquid crystal display element via connecting members, said connecting members including a first connecting member having therein a first group of a plurality of conductive pieces arranged with a spacing which is narrower than said first predetermined spacing so that both ends of each conductive piece will be exposed respectively toward said first electrode terminal group and said third electrode terminal group, said first connecting member being covered by an insulative material, and a second connecting member having therein a second group of a plurality of conductive pieces arranged with a spacing which is narrower than said first predetermined space so that both ends of each conductive piece will be exposed respectively toward said second electrode terminal group and said fourth electrode terminal group, said second conecting member being covered by an insulative material, said liquid crystal display element and said drive circuit substrate being held by pressure applying means with said connecting members disposed therebetween, and said first connecting member and said second connecting member being integrated, said integrated connecting member having therein said first group of conductive pieces and said second group of conductive pieces in the form of two rows.

* * * * *